(12) United States Patent
Idesawa et al.

(10) Patent No.: US 6,847,025 B1
(45) Date of Patent: Jan. 25, 2005

(54) SEMICONDUCTOR IMAGE POSITION SENSITIVE DEVICE

(75) Inventors: Masanori Idesawa, Tsurugashima (JP); Toyomi Fujita, Tanashi (JP); Yasushige Yano, Wako (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 09/429,080

(22) Filed: Oct. 29, 1999

(30) Foreign Application Priority Data

Oct. 30, 1998 (JP) .............................. 10-309765

(51) Int. Cl.$^7$ .......................... H01L 27/00; H01J 40/14
(52) U.S. Cl. ............................. 250/208.1; 250/214 R; 250/214.1
(58) Field of Search .......................... 257/461, 294, 257/431, 656, 40, 458; 250/208.1, 214.1, 214 R, 214 L, 214 C; 348/241, 243

(56) References Cited

U.S. PATENT DOCUMENTS

| | | | |
|---|---|---|---|
| 3,984,677 A | | 10/1976 | Hosoe et al. |
| 5,113,063 A | * | 5/1992 | Idesawa .................... 250/201.4 |
| 5,396,280 A | * | 3/1995 | Caiozza et al. ............. 348/126 |
| 5,635,705 A | * | 6/1997 | Saunders ............... 250/214 RC |
| 6,208,006 B1 | * | 3/2001 | McElvain et al. .......... 257/443 |

FOREIGN PATENT DOCUMENTS

| | | |
|---|---|---|
| JP | 62-264678 A | 11/1987 |
| JP | 63-200088 A | 8/1988 |
| JP | 05-118847 * | 5/1993 |
| JP | 10-12856 A | 1/1998 |

* cited by examiner

Primary Examiner—Stephone B. Allen
(74) Attorney, Agent, or Firm—Birch, Stewart, Kolasch & Birch, LLP (57) ABSTRACT

In order to reduce errors in sensing an image position derived from noise light such as background noise, a semiconductor image position sensing device is provided with a photoelectric layer generating a photoelectric current in a portion onto which light was input in response to intensity of the light input to the photoelectric layer, a resistance layer laminated on the photoelectric layer in which the photoelectric current generated in the photoelectric layer flows into a portion corresponding to that onto which the light was input, and signal current output terminals wherein the photoelectric current generated in the photoelectric layer is distributed in a ratio in response to a resistance value between the signal current output terminals and the resistance layer defined at a position where the photoelectric current flowed into the resistance layer and from which the photoelectric current is output as an electric current obtained by summing currents over the whole sensing sections altogether, comprising further a resistance subtracting a photoelectric current having a predetermined distribution of electric current density from photoelectric currents generated in respective portions of the photoelectric layer over the whole sensing sections, and the photoelectric current subtracted by means of the resistance being adapted to flow into the resistance layer.

4 Claims, 9 Drawing Sheets

SEMICONDUCTOR IMAGE POSITION SENSITIVE DEVICE

BACKGROUND OF THE INVENTION

1. Field of the Invention

The present invention relates to a semiconductor image position sensing device, and more particularly to a semiconductor image position sensing device for sensing a position of a spot image at high speed. Especially, the invention relates to a semiconductor image position sensing device used in a sensor for determining an optical position in a variety of automation systems or a variety of optical measuring systems and suitable for realizing a high-speed and simple sensing system or measuring system.

2. Description of the Related Art

Heretofore, a semiconductor image position sensitive device has been known as a sensor for detecting simply a spot image position at high speed.

In general, a semiconductor image position sensitive device is composed of a photoelectric layer, a dividing resistance layer laminated on the photoelectric layer, and signal current output terminals connected to the dividing resistance layer. Such a semiconductor image position sensitive device is constituted on the basis of a basic principle that when light irradiated from a spot is input to the photoelectric layer, a photoelectric current is generated in the photoelectric layer, the photoelectric current thus generated in the photoelectric layer is allowed to flow into the dividing resistance layer, whereby the photoelectric current distributed in response to a resistance value between an inflow portion of the photoelectric current in the dividing resistance layer and the signal current output terminals is settled, and a center position of incident light into the photoelectric layer is calculated based on an electric current value output from the signal current output terminals.

A conventional semiconductor image position sensitive device constituted on the basis of the above described basic principle will be explained in detail herein by referring to the accompanying drawings.

Figure 1:
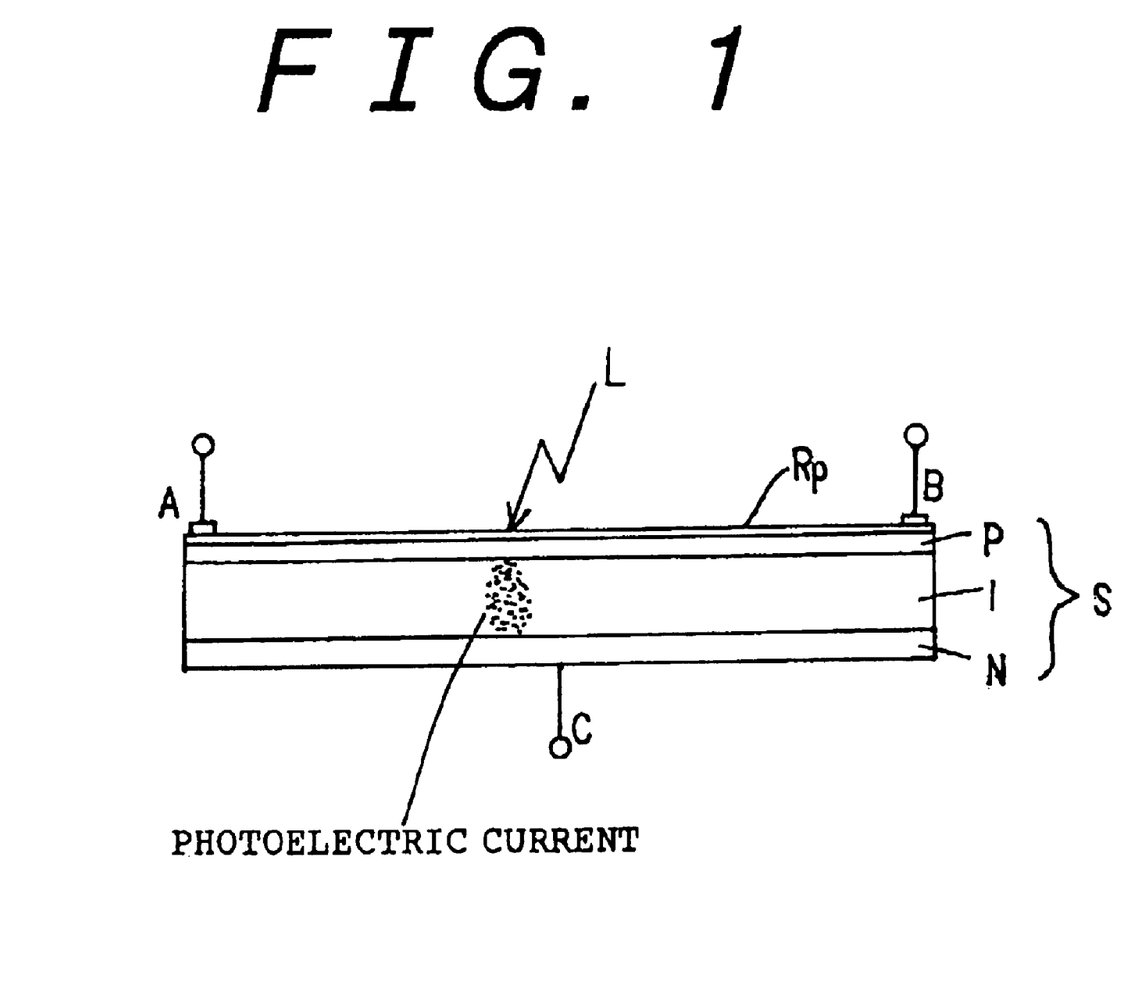
FIG. 1 is a conceptual view showing a structure of a conventional semiconductor image position sensitive device.
Figure 2:
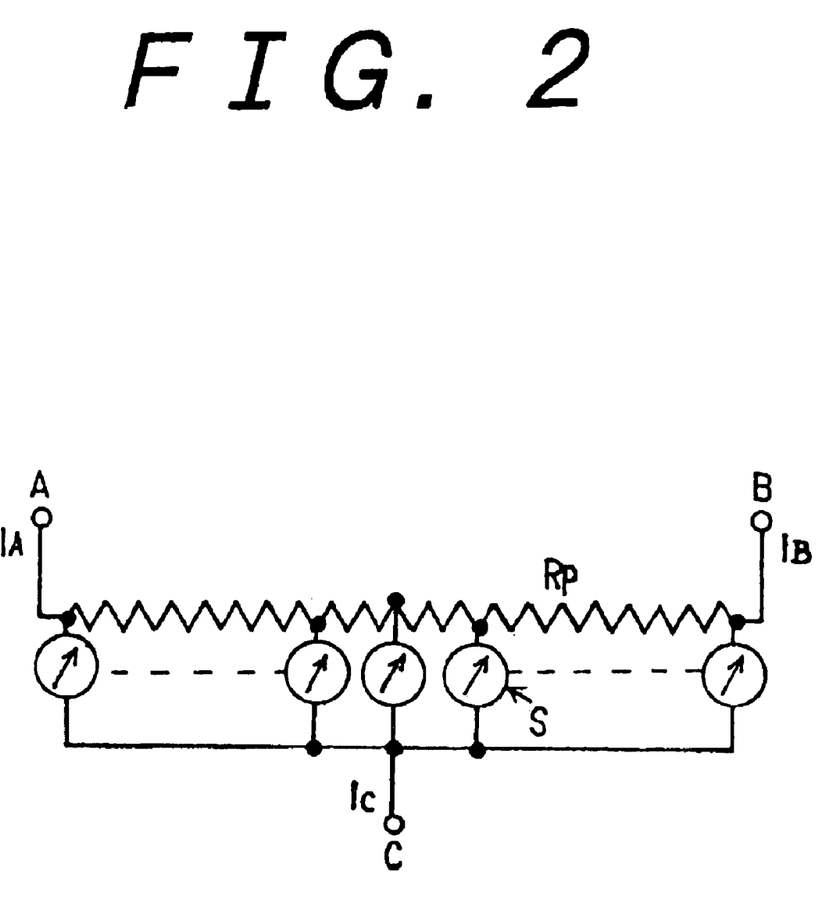
FIG. 2 is a conceptual diagram of an equivalent circuit exhibiting a principle for calculating image position sensing in the semiconductor image position sensing device shown in FIG. 1.

Namely, FIG. 1 is a conceptual view showing the structure of a conventional semiconductor image position sequence device. FIG. 2 is a conceptual diagram of an equivalent circuit exhibiting a principle of the calculation for sensing an image position in the semiconductor image position sensitive device of FIG. 1. The semiconductor image position sensitive device comprises a P-type semiconductor layer P, and insulator layer I laminated on the bottom side of the P-type semiconductor layer P, an N-type semiconductor layer N laminated on the bottom side of the insulator layer P, a resistance layer $R_p$ for calculating an image position and which is laminated on the surface side of the P-type semiconductor layer P, a signal current output terminal A as well as a signal current output terminal B formed on the opposite ends of the resistance layer $R_p$ on the surface side thereof, and a bias terminal C formed on the bottom side of the N-type semiconductor layer N at the central portion thereof.

In the above described semiconductor position sensitive device S, a photoelectric layer S is formed from the P-type semiconductor layer P, the insulator layer I, and the N-type semiconductor layer N, while the dividing resistance layer is formed from the resistance layer $R_p$.

In such semiconductor image position sensitive device as described above, when light L is irradiated from the surface side of the resistance layer $R_p$, photoelectric current generated in the photoelectric current layer S at an incident position of the light L flows into the resistance layer $R_p$, the photoelectric current thus flowed into the resistance layer $R_p$ is distributed in response to a resistance value defined between a position at which the photoelectric current flowed into the resistance layer $R_p$ and the signal current output terminals A and B, whereby output signal currents $I_A$ and $I_B$ are output from the signal current output terminals A and B, respectively (see FIG. 2).

In this case, when it is supposed that resistivity of the resistance layer $R_p$ is constant, the resistance value is proportional to a distance defined between the position at which photoelectric current is flowed into the resistance layer $R_p$ and the signal current output terminals A and B, so that information X at an incident position of the light L (being equivalent to a ratio of dislocation from the central position of the resistance layer $R_p$) is determined by an equation (1):

$$x = (I_A - I_B)/(I_A + I_B) \quad (1)$$

In the meantime, the photoelectric current layer is continuous, and the resistance layer $R_p$ being a dividing resistance for calculating an image position is formed as a thin film superposed on the photoelectric layer S in the semiconductor image position sensitive device shown in FIGS. 1 and 2.

However, it is not so easy that the resistance layer $R_p$ being a dividing resistance for calculating an image position is formed stably as a uniform thin film having a predetermined resistivity, and as a result, such resistivity cannot be made constant, whereby a distribution of the resistivity becomes scattered. Thus, there is a problem that the scattering becomes a factor of an error in sensing for image position.

In order to solve such a problem as described above, a semiconductor image position sensitive device of separate photoelectric device type is devised wherein a photoelectric layer is fabricated as a separate photoelectric layer of a split structure separated into plural sections being independent of a dividing resistance layer, while the dividing resistance layer is fabricated stably as a constriction resistance at a position away from the separate photoelectric layer, and photoelectric currents generated in the split photoelectric layer having a structure which has been separated and split individually into sections are allowed to flow condensedly into positions corresponding to the dividing resistance layer.

Figure 3:
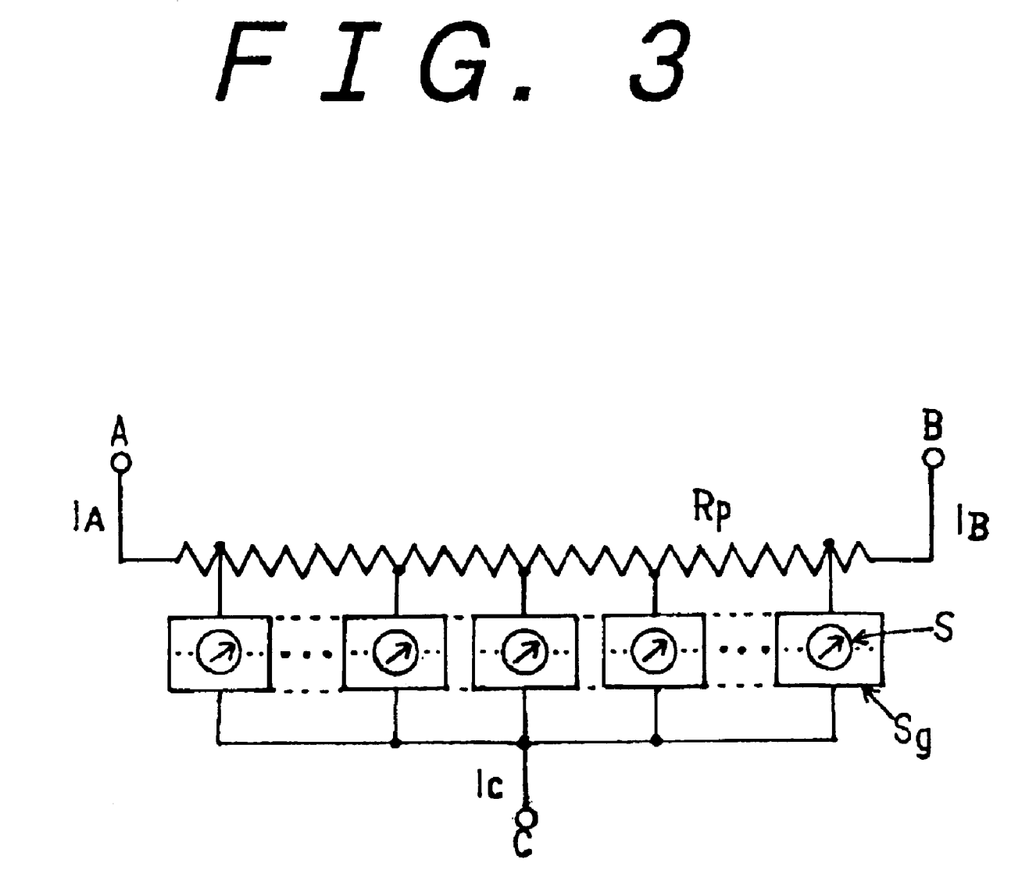
FIG. 3 is a conceptual diagram of an equivalent circuit exhibiting a principle of a semiconductor image position sensitive device of separate photoelectric device type.

FIG. 3 is a conceptual diagram of an equivalent circuit exhibiting a principle of such semiconductor image position sensitive device of a separate photoelectric device type as described above.

In FIG. 3, reference character $S_g$ designates a separated photoelectric layer in the semiconductor image position sensitive device of a split photoelectric device type. According to the semiconductor image position sensitive device of a split photoelectric device type as described above, a resistance layer $R_p$ can be stably fabricated as a dividing resistance for calculating an image position Thus, errors in sensing an image position are allowed to decrease, so that it is possible to improve stability in sensing an image position.

Furthermore, a photoelectric current generated by irradiating the light L in any structure in any semiconductor image position sensitive device as described above shown in FIGS. 1 through 3 is output from the signal current output terminal A as an output signal electric current $I_A$, while it is output from the signal current output terminal B as an output signal current $I_B$ (see FIGS. 2 and 3). Accordingly, when a calculation is made on the basis of the equation (1) by applying the output signal currents $I_A$ and $I_B$, it becomes possible to calculate a position of spot image by means of an analog arithmetic circuit at extremely high-speed.

Meantime, a gravitational position of all the light L input to a sensing region of light is sensed, but not the brightest point of a spot image in a semiconductor image position sensitive device based on the principle applying the above described equation (1). For this reason, it has been pointed out that there is such a problem that when a noise light such as background light occupying a large area though brightness is not high exists in a wide region in a peripheral section of an objective spot image, a significant error appears at a sensing position of light as a result of influence of noise light such as background noise.

Figure 4:
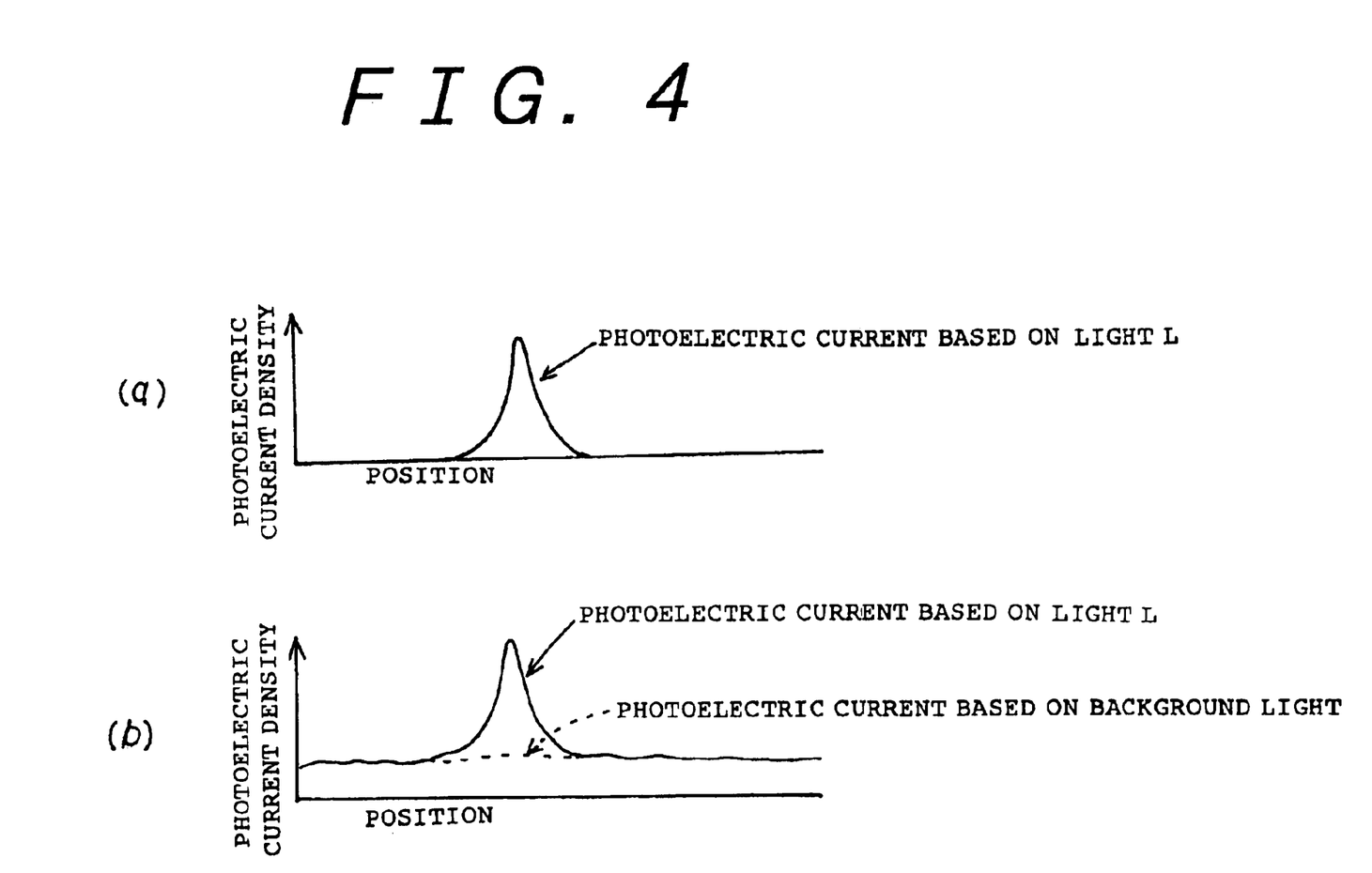
FIG. 4(a) is a conceptual diagram showing a distribution of photoelectric current density based on irradiation of light derived from a spot image.
FIG. 4(b) is a conceptual diagram showing a distribution of photoelectric current density in the case where noise light such as background light exists.

In other words, if no background light exists in a wide region extending over the peripheral part around the objective spot image, a distribution of photoelectric current based on the light L derived from the spot image is as shown in FIG. 4(a). However, when noise light such as background light exists, a photoelectric current based on the noise light is also generated in a photoelectric layer S (separate photoelectric layer Sg), so that the resulting photoelectric current based on noise light such as background light is superposed on the photoelectric current based on the light L derived from the spot image, and hence, a distribution of photoelectric current becomes as shown in FIG. 4(b).

More specifically, when output signal currents $I_A$ and $I_B$ obtained from a photoelectric current onto which has been superposed noise light are applied to the equation (1) in case of existing noise light, a position of the spot image is calculated. As a result, such position of the spot image is biased towards a direction of gravitational position of noise light, so that there is a problem of generating a remarkable error in sensing the position.

When a further specific explanation is made in this respect, a photoelectric current generated in response to the light derived from a spot image is distributed to be output in accordance with a resistance value between a flowing-in position and output terminals because of presence of a dividing resistance in a semiconductor image position sensitive device, and when electric current values of the photoelectric currents which have been thus distributed to be output (output signal currents $I_A$ and $I_B$) are calculated, a central position of the incident light L is determined.

For this reason, not only a photoelectric current generated in response to irradiation of the light L derived from a spot image as a signal to be sensed, but also a photoelectric current produced from noise light is reflected with respect to the output signal currents $I_A$ and $I_B$ in the case where noise light such as background light exists.

In order to avoid influence of such noise light, such a manner that a spot to be sensed is flashed on and off, an output in the case where the spot is flashed off is subtracted from an output in the case where the spot is flashed on, whereby influence of background light is removed has been heretofore applied.

However, the above described manner can be applied in only the case where spot can be flashed on and off, besides the case where noise light does not depend upon flashing on and off of the spot. In this respect, there is no effect with respect to reduction of errors due to noise light produced by irradiation of the light L derived from the spot.

In general, a density of a photoelectric current generated by noise light such as background light is considerably lower than that of a photoelectric current generated by irradiation of the light derived from a spot. However, since an area of incidence in noise light towards a photoelectric layer is remarkably wider than that of light derived from a spot towards the photoelectric layer, contributions upon the output signal currents $I_A$ and $I_B$ of the noise light are unable to disregard as a whole.

Accordingly, a position of gravity obtained by calculating the output signal currents $I_A$ and $I_B$ is dragged by a gravity of noise light such as background light, so that such a value which is deviated from a primary position of the spot is obtained. Thus, there is a problem wherein an error in case of sensing an image position becomes remarkable.

In this respect, since noise light such as background light is averagely distributed within a sensing region of a semiconductor image position sensitive device in general, a gravitational position of output signal currents $I_A$ and $I_B$ derived from noise light such as background light is in the vicinity of a central portion of a sensing region, so that a position for sensing an image is dragged by such result as described above, whereby the resulting value becomes the one which deviates towards the central portion of the sensing region.

OBJECTS AND SUMMARY OF THE INVENTION

The present invention has been made in view of the above described problems involved in the prior art. An object of the invention is to provide a semiconductor image position sensitive device by which errors in sensing an image position produced by influence of noise light such as background light are reduced.

In order to achieve the above described object, a semiconductor image position sensitive device according to the present invention has been made on the basis of such face that a photoelectric current density based on noise light such as background light is considerably lower than that based on irradiation of light derived from a spot image. The present invention is further constituted in such that a photoelectric current flowing into a dividing resistance contains dominantly a photoelectric current generated on the basis of a spot image by subtracting a substantially equal photoelectric current having a distribution of electric current density corresponding to that of an electric current generated on the basis of noise light from photoelectric currents generated in respective portions in a photoelectric layer. When it is constituted in such that a photoelectric current having a value corresponding to that of a photoelectric current based substantially on noise light is subtracted in a region where the photoelectric current based on background light and to be subtracted has a higher value than that of the photoelectric current generated on the basis of a high density of photoelectric current, in other words, an electric current obtained only from the part corresponding to an incident position of light derived from a spot image flows into a dividing resistance.

Therefore, in accordance with a semiconductor image position sensitive device of the present invention, a ratio of contribution of a photoelectric current produced by noise light such as background light can be remarkably reduced with respect to an electric current flowing into a dividing resistance relevant to sensing for an image position, whereby errors in sensing an image position due to noise light such as background light can be significantly reduced.

Namely, a semiconductor image position sensing device according to the present invention is the one provided with a photoelectric layer generating a photoelectric current in a portion onto which light was input in response to intensity of the light input to the photoelectric layer, a resistance layer laminated on the photoelectric layer in which the photoelectric current generated in the photoelectric layer flows into a portion corresponding to that onto which the light was input, and signal current output terminals wherein the photoelectric current generated in the photoelectric layer is distributed in a ratio in response to a resistance value between the signal current output terminals and the resistance layer defined at a position where the photoelectric current was flowed into the resistance layer and from which the photoelectric current is output as an electric current obtained by summing currents over the whole sensing sections altogether, comprising further a resistance subtracting a photoelectric current having a predetermined distribution of electric current density from photoelectric currents generated in respective portions of the photoelectric layer over the whole sensing sections, and the photoelectric current subtracted by means of the resistance being adapted to flow into the resistance layer.

Furthermore, the semiconductor image position sensitive device of the invention, wherein the resistance subtracts an electric current having a predetermined density distribution in a section where each density of the photoelectric currents generated in respective sections of the photoelectric layer in response to incident light is higher than the predetermined electric current density, while the resistance subtracts an electric current having a density distribution corresponding to that of the photoelectric current in a section where each density of the photoelectric is lower than that of the predetermined electric current density.

Still further, the semiconductor image position sensitive device of the invention, wherein the photoelectric layer generating a photoelectric current in response to intensity of light is separated into plural portions and they are adapted to act as individual photoelectric devices, respectively, photoelectric currents generated in the photoelectric device which have been separated into the plural portions are adapted to flow concentratively into the resistance layer in each of the portions corresponding to respective positions, an electric current to be subtracted having a predetermined distribution of electric current density is the one obtained by putting them corresponding to the respective separated photoelectric devices together, and remainders as a result of subtraction from the photoelectric currents of the separated photoelectric devices, respectively, are adapted to flow into the resistance layer.

Yet further, the semiconductor image position sensitive device of the invention is, wherein an electric current obtained by subtracting an electric current put together from a photoelectric current is adapted to flow into the resistance layer in the case where photoelectric currents generated in response to projectile light in the respective separated photoelectric devices are larger than an electric current obtained by putting together an electric current to be subtracted having a predetermined distribution of electric current density with respect to those corresponding to the respective separated photoelectric devices, while an electric current obtained by subtracting the photoelectric currents generated in the photoelectric devices is adapted to flow into the resistance layer in the case where the former photoelectric currents are smaller than the latter electric currents.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Examples of preferred embodiments of the semiconductor image position sensitive device according to the present invention will be described in detail hereinafter in conjunction with the accompanying drawings.

It is to be noted that the same or equivalent components as or to those of FIGS. 1 through 4 are designated by the same reference characters in FIGS. 5 through 9 wherein the detailed description relating thereto will be omitted.

Figure 5:
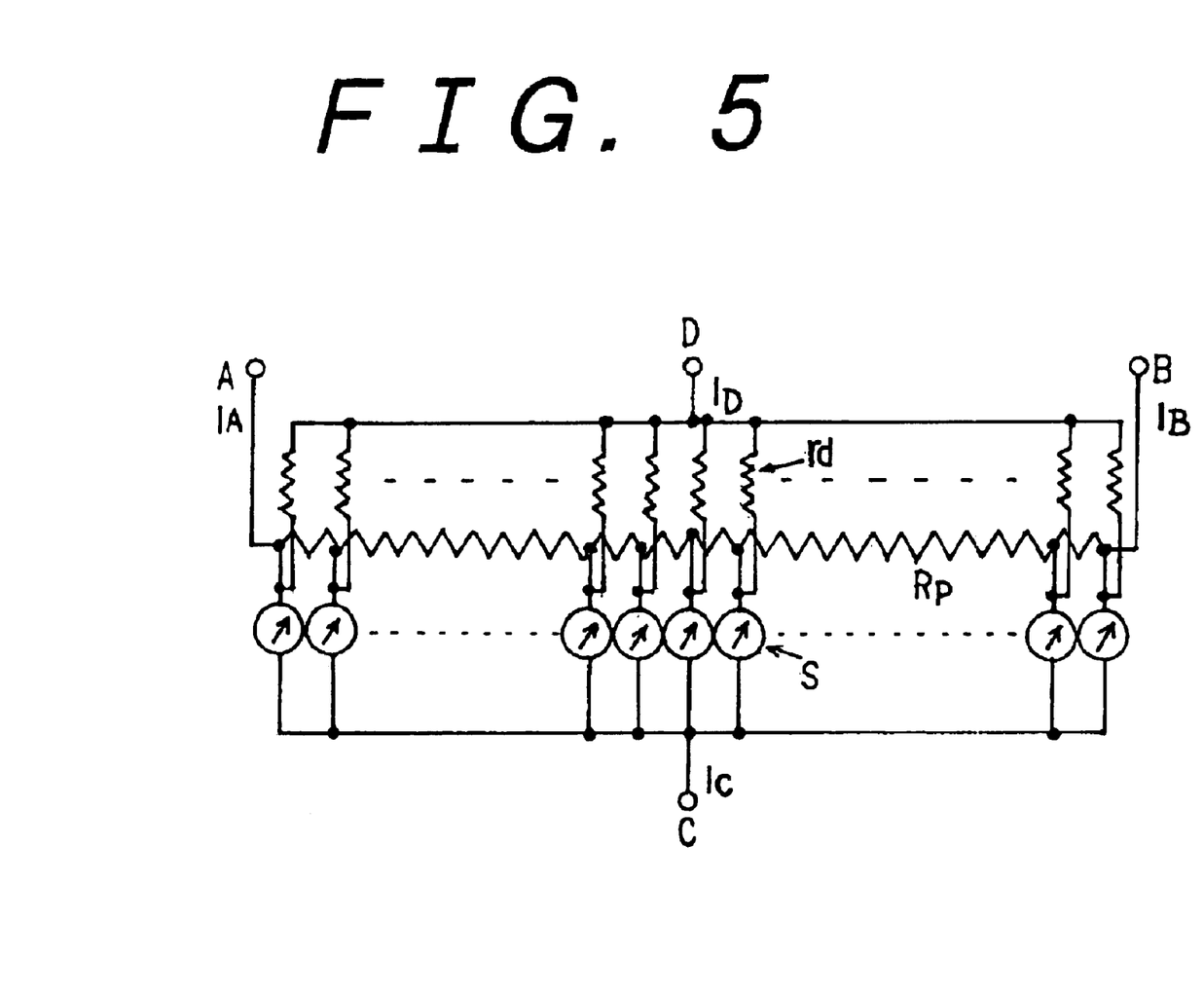
FIG. 5 is a conceptual diagram showing an example of an equivalent circuit exhibiting a principle of a semiconductor image position sensitive device according to the present invention wherein the semiconductor image position sensitive device is the one of a continuous photoelectric device type.

FIG. 5 shows an example of preferred embodiments of a semiconductor image position sensitive device according to the present invention wherein the semiconductor image position sensitive device is constituted in such that an electric current obtained by subtracting-an amount of electric current corresponding to a current density of noise light such as background light from the photoelectric current shown in FIG. 4(b) flows into a dividing resistance for calculating an image position.

More specifically, FIG. 5 shows an equivalent circuit representing an example of the preferred embodiments of a semiconductor image position sensitive device according to the present invention wherein the present semiconductor image position sensitive device is the one of a continuous photoelectric device type to which has been connected a subtracting current limiting resistance rd for subtracting an electric current having a wider distribution of electric current density than that of a photoelectric current based on noise light such as background light.

Accordingly, it becomes possible that flowing of a photoelectric current generated on the basis of noise light such as background light into a resistance layer RP being a dividing resistance for calculating an image position is significantly reduced by the use of the subtracting current limiting resistance rd.

More specifically, when it is constituted in such that an electric current having a somewhat wider distribution of electric current density than that of a photoelectric current based on noise light such as background light is subtracted by means of the subtracting electric current limiting resistance rd, a substantially equivalent value to that of the photoelectric current can be subtracted from a photoelectric current extending over a whole sensing region in reality, and as a result, only a photoelectric current based substantially on a spot image flows ideally into the resistance layer $R_p$ being a dividing resistance for calculating an image position as shown in FIG. 7(b).

Figure 6:
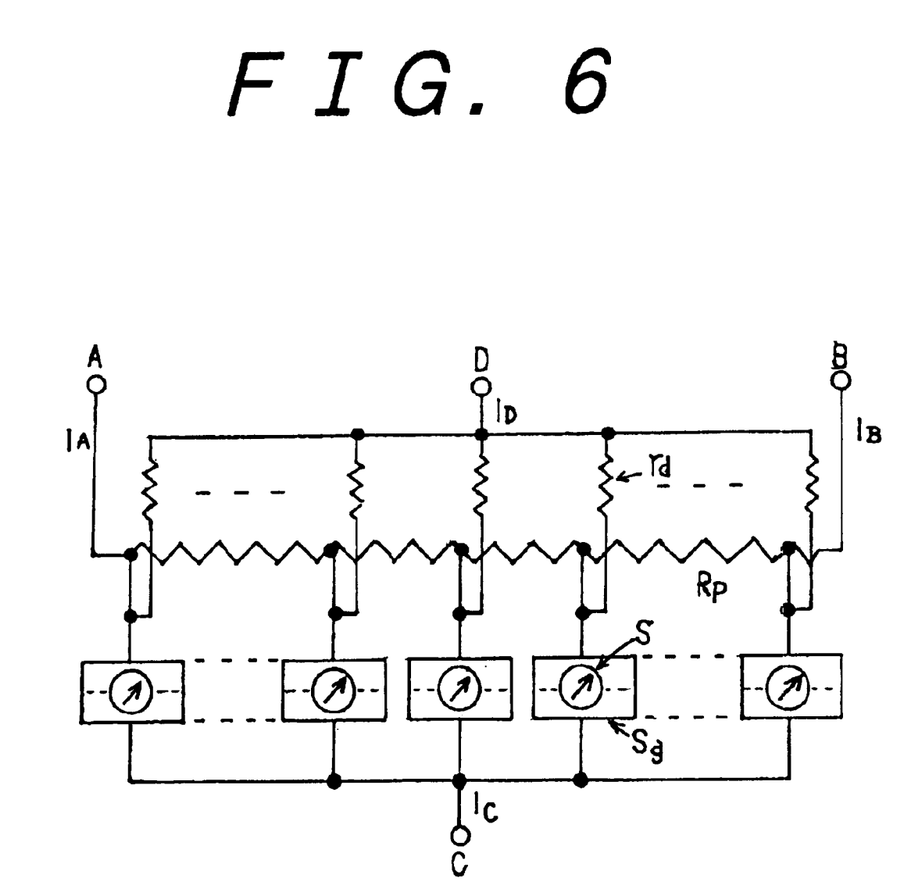
FIG. 6 is a conceptual diagram showing an example of an equivalent circuit exhibiting a principle of a semiconductor image position sensitive device according to the present invention wherein the semiconductor image position sensitive device is the one of a separate photoelectric device type.
Figure 7:
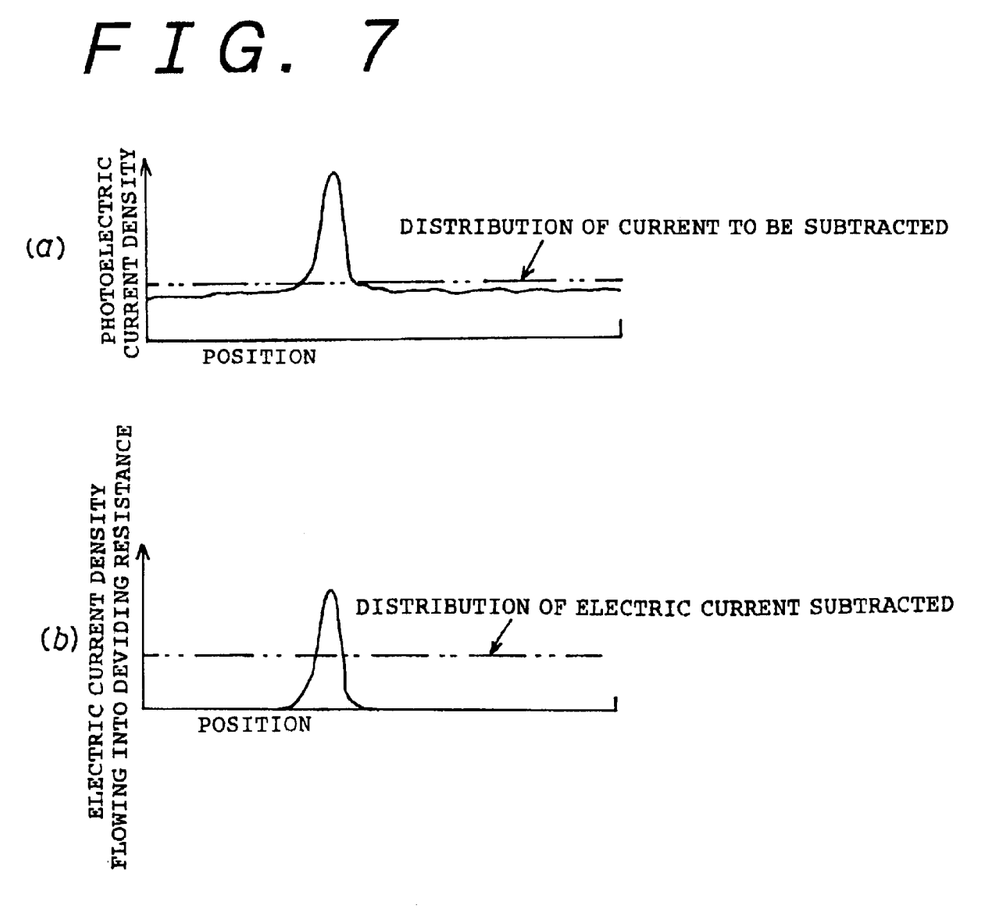
FIG. 7(a) is a conceptual diagram showing a distribution of photoelectric current density in the case where noise light such as background light exists.
FIG. 7(b) is a conceptual diagram showing a distribution of photoelectric current density in the case where a photoelectric current based on noise light such as background light is subtracted.

FIG. 6 shows an equivalent circuit representing an example of the preferred embodiments of a semiconductor image position sensitive device according to the present invention wherein the present semiconductor image position sensitive device is the one of a separate photoelectric-device type to which has been connected a subtracting current limiting resistance rd for subtracting an electric current having a somewhat wider distribution of electric current density than that of a photoelectric current based on noise light such as background light.

Since a function of the subtracting electric current limiting resistance rd has been described in the example shown in FIG. 5, the explanation therefor will be omitted.

Furthermore, when a resistance value of the subtracting electric current limiting resistance rd is set at a lower value than that of the resistance layer $R_p$, interference between the adjacent portions in case of subtracting electric current by means of the subtracting electric current limiting resistance rd can be reduced.

Figure 8:
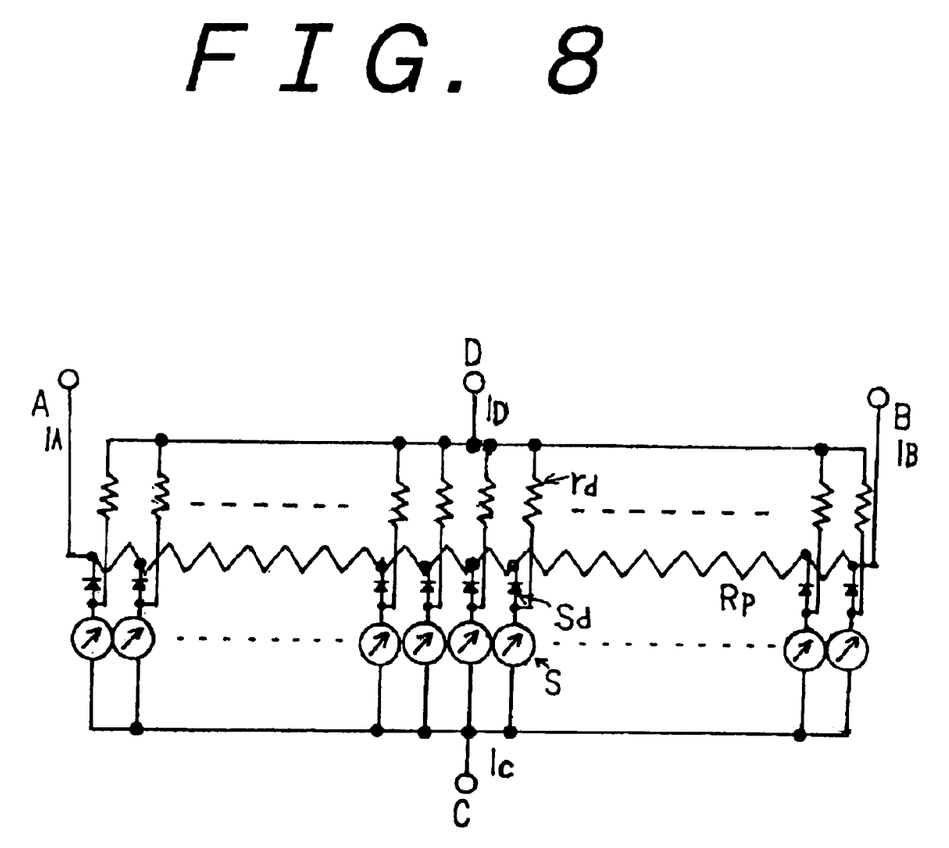
FIG. 8 is a conceptual diagram showing an example of an equivalent circuit exhibiting a principle of a semiconductor image position sensitive device according to the present invention into which has been inserted a diode for preventing interference wherein the semiconductor image position sensitive device is the one of a continuous photoelectric device type.

Moreover, FIG. 8 shows an equivalent circuit representing an example of the preferred embodiments of a semiconductor image position sensitive device according to the present invention wherein the present semiconductor image position sensitive device is the one of a continuous photoelectric device type to which has been connected a subtracting current limiting resistance rd for subtracting an electric current having a wider distribution of electric current density than that of a photoelectric current based on noise light such as background light, and in addition, into which a diode Sd for preventing interference has been inserted.

Thus, it is arranged in such that interference between adjacent portions in case of subtracting a photoelectric current based on noise light such as background light is avoided by inserting the diode Sd for preventing interference in the equivalent circuit. In this case, it becomes possible to constitute the equivalent circuit in such that a photoelectric current having a value equivalent to that of a photoelectric current generated as a result of irradiation of light upon a spot image is subtracted in a region where a value of a photoelectric current to be subtracted is larger than that of the photoelectric current based on irradiation of light upon the spot image, so that an electric current which flows into the resistance layer $R_p$ in that region becomes substantially zero.

Figure 9:
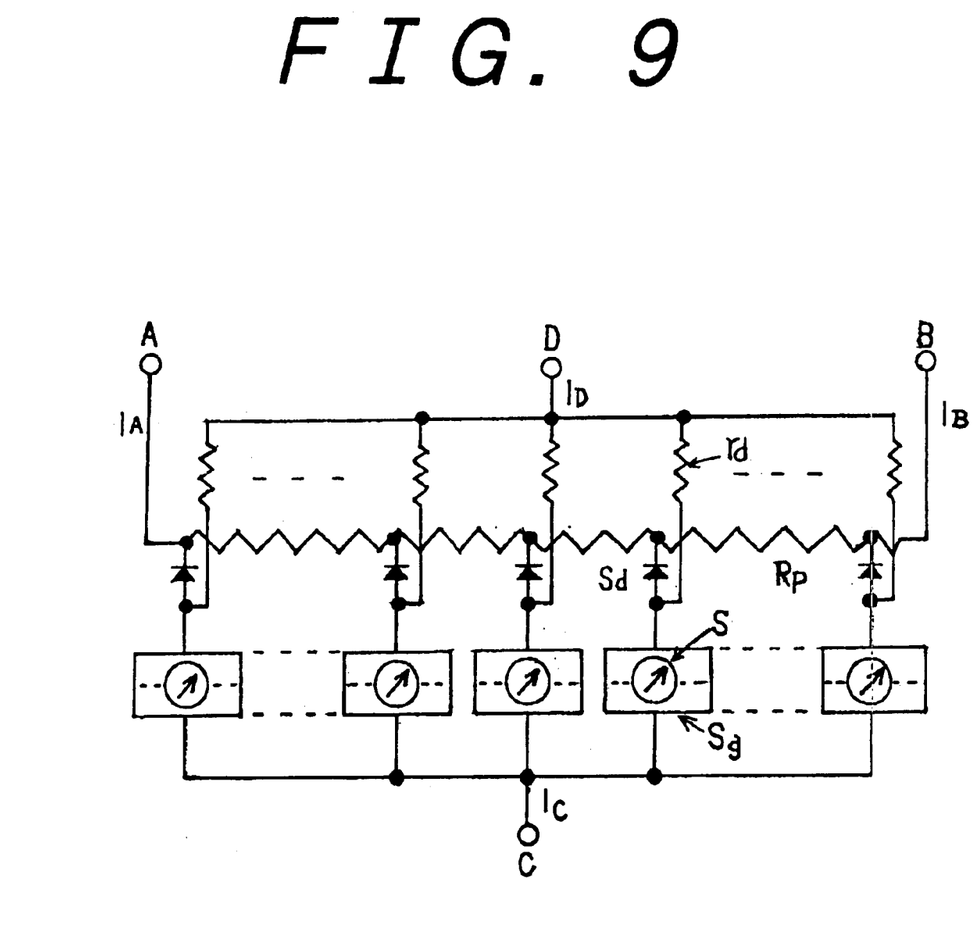
FIG. 9 is a conceptual diagram showing an example of an equivalent circuit exhibiting a principle of a semiconductor image position sensitive device according to the present invention into which has been inserted a diode for preventing interference wherein the semiconductor image position sensitive device is the one of a separate photoelectric device type.

Still further, FIG. 9 shows an equivalent circuit representing an example of the preferred embodiments of a semiconductor image position sensitive device according to the present invention wherein the present semiconductor image position sensitive device is the one of a separate photoelectric device type to which has been connected a subtracting current limiting resistance rd for subtracting an electric current having a wider distribution of electric current density than that of a photoelectric current based on noise light such as background light, and in addition, into which a diode Sd for preventing interference has been inserted.

According to the present invention, since a semiconductor image position sensitive device has been constituted as described above, the invention exhibits such excellent advantage that occurrence of errors in sensing an image position which are derived from noise light such as background noise can be reduced.

It will be appreciated by those of ordinary skill in the art that the present invention can be embodied in other specific forms without departing from the spirit or essential characteristics thereof.

The presently disclosed embodiments are therefore considered in all respects to be illustrated and not restrictive. The scope of the invention is indicated by the appended claims rather than the foregoing description, and all changes that come within the meaning and range of equivalents thereof are intended to be embraced therein.

The entire disclosure of Japanese Patent Application No. 10-309765 filed on Oct. 30, 1998 including specification, claims, drawings and summary are incorporated herein by reference in its entirety.

What is claimed is:

1. A semiconductor image position sensing device provided with a photoelectric layer generating a photoelectric current in a portion onto which light was input in response to intensity of the light input to the photoelectric layer, a resistance layer laminated on said photoelectric layer in which the photoelectric current generated in said photoelectric layer flows into one of a plurality of portions of said resistance layer corresponding to that onto which said light was input, and signal current output terminals wherein the photoelectric current generated in said photoelectric layer is distributed in a ratio in response to a resistance value between the signal current output terminals and said resistance layer defined at a position where the photoelectric current was flowed into said resistance layer and from which the photoelectric current is output as an electric current obtained by summing currents over all of the plurality of the portions of said resistance layer, comprising:

a resistance subtracting a photoelectric current having a predetermined distribution from photoelectric currents generated in respective portions of the photoelectric layer over all of said photoelectric layer, and the photoelectric current having a predetermined distribution, which is subtracted by said resistance flows into said resistance layer.

2. The semiconductor image position sensitive device as claimed in claim 1, wherein said resistance subtracts the predetermined photoelectric current having a predetermined distribution in a section where each density of the photoelectric currents generated in respective sections of said photoelectric layer in response to incident light is higher than the predetermined electric current, while said resistance subtracts an electric current having a density distribution corresponding to that of the photoelectric current in a section where each density of the photoelectric currents is lower than that of the said predetermined electric current.

3. The semiconductor image position sensitive device as claimed in any one of claims 1 and 2, wherein said photoelectric layer generating a photoelectric current in response to intensity of light is separated into plural portions and they are adapted to act as individual photoelectric devices, respectively, photoelectric currents generated in the photoelectric layer which have been separated into the plural portions are adapted to flow concentratively into the resistance layer in each of the portions corresponding to respective positions, an electric current to be subtracted having a predetermined distribution of electric current density corresponding to the respective separated photoelectric devices being put together, and remainders as a result of subtraction from the photoelectric currents of the separated photoelectric devices, respectively, are adapted to flow into the resistance layer.

4. The semiconductor image position sensitive device as claimed in claim 3, wherein an electric current obtained by subtracting an electric current put together from a photoelectric current is adapted to flow into the resistance layer in the case where photoelectric currents generated in response to projectile light in the respective separated photoelectric devices are larger than an electric current obtained by putting together an electric current to be subtracted having a predetermined distribution of electric current density with respect to those corresponding to the respective separated photoelectric devices, while an electric current obtained by subtracting the photoelectric current generated in the photoelectric devices is adapted to flow into the resistance layer in the case where the former photoelectric currents are smaller than the latter electric currents.

* * * * *